United States Patent [19]

Detering

[11] 4,219,784
[45] Aug. 26, 1980

[54] PHASE DETECTION SYSTEM USING SAMPLE AND HOLD TECHNIQUE, AND PHASE LOCKED LOOP USING SUCH PHASE DETECTION SYSTEM

[75] Inventor: Richard L. Detering, Buffalo, N.Y.

[73] Assignee: Westinghouse Electric Corp., Pittsburgh, Pa.

[21] Appl. No.: 956,141

[22] Filed: Oct. 27, 1978

[51] Int. Cl.$^2$ ............................................. H03B 3/04
[52] U.S. Cl. ...................................... 331/27; 328/134; 328/151; 328/155; 331/1 A
[58] Field of Search ................ 307/232; 328/133, 134, 328/151, 155; 331/25, 27, 1 A

[56] References Cited

U.S. PATENT DOCUMENTS

| | | | |
|---|---|---|---|
| 3,717,818 | 2/1973 | Herbst | 307/232 X |
| 3,740,586 | 6/1973 | Banks et al. | 328/151 X |
| 4,068,181 | 1/1978 | Clark et al. | 328/133 |
| 4,128,811 | 12/1978 | Englund, Jr. | 328/134 |

Primary Examiner—Siegfried H. Grimm
Attorney, Agent, or Firm—C. M. Lorin

[57] ABSTRACT

A phase detector circuit is connected to a sine wave reference during a time interval of one-half cycle of the sine wave to be compared. Phase detection is provided by integrating the inputted sine wave reference during such time interval, and immediately following. such accumulation of information, the latter is transferred to a holding circuit. The phase detector is applied to a phase locked loop in which the time intervals are established digitally to control FET devices for the sampling and holding functions.

3 Claims, 10 Drawing Figures

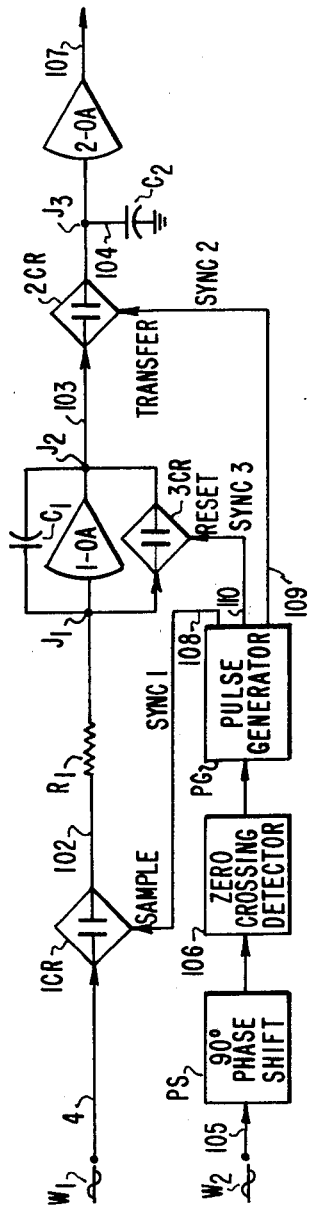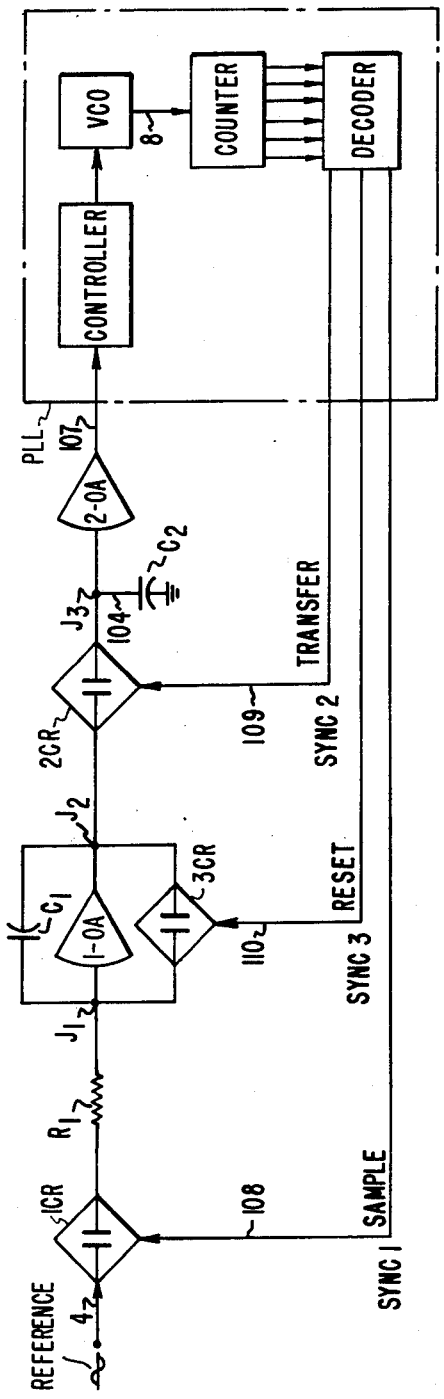

PHASE DETECTION SYSTEM USING SAMPLE AND HOLD TECHNIQUE, AND PHASE LOCKED LOOP USING SUCH PHASE DETECTION SYSTEM

BACKGROUND OF THE INVENTION

The invention relates to the art of phase detection. It is applied in particular to a phase locked loop (PLL) in which context it affords cancellation of periodic "noise" and harmonics effects, while avoiding modulation of the frequency of the VCO of the PLL by the output ripple of the phase detector. The invention is readily implemented with solid state devices.

Reference is made to "Phase Lock Techniques" by Floyd M. Gardner, published by John Wiley-1967, second printing, pgs. 1–16, chapters 1 and 2.

It is known from U.S. Pat. No. 3,944,938 of Michel Brouant to compare two signals of different phases by modulation of one by the other at the input of an integrator for phase control. However, this does not teach phase detection in a sample and hold manner as disclosed herein, nor for phase detection per se.

SUMMARY OF THE INVENTION

In contrast to any prior art known, the present invention resides in sampling the reference wave during a selected time interval which is related to the time scale of the wave to be compared, and to integrate the sampled wave therethrough to derive an indication of the phase difference. A hold circuit retains the phase difference information derived until updated with the phase difference information obtained from the following cycle, thereby updating the detected phase value once per cycle.

BRIEF DESCRIPTION OF THE DRAWINGS

FIG. 1A schematically shows the phase detection system according to the present invention applied to the detection of the phase between two wave forms.

FIG. 1B shows the system of FIG. 1A as part of a phase locked loop.

DETAILED DESCRIPTION OF THE INVENTION

Referring to FIG. 1, circuit is shown for detecting the phase between two wave forms $W_1$ and $W_2$ of the same frequency. Wave form $W_1$ is applied on line 4 through a path including a switch 1CR, line 102, register R1, junction J1 and the inverting input of operational amplifier 1-OA mounted as an integrator by a negative feedback loop including a capacitor C1. As a result, when switch 1 CR is closed, register R1 and capacitor C1 integrate the input signal. At the output J2 appears the integrated value of $W_1$. In parallel with capacitor C1 is mounted a switch 3CR short-circuiting and resetting the capacitor when it is closed. From junction J2 the output of 1-OA is fed via a third switch 2CR to one side of a capacitor C2 connected at the non-inverting input of a second operational amplifier 2-OA which is a unity gain buffer for C2. Therefore, when switch 2CR is closed, capacity C2 acts as a hold capacitor. The voltage of junction J2 appears at junction J3 and by line 104 charges capacitor C2. The charge stored in capacitor C2 is translated by operational amplifier 2-OA to the output on line 107.

The second wave W2 on line 105 is converted by a phase shifter PS into a wave form at 90° and the outputted wave is applied to a zero-crossing detector which is used to clock a pulse generator PG, thus, in synchronism with the zero-crossings of the phase shifted wave. The pulse generator PG generates three signals SYNC 1 (on line 108), SYNC 2 (on line 109) and SYNC 3 (on line 110) which control the three switches 1CR, 2CR and 3CR, respectively. These switches are preferably FET devices, which are static devices and electronically controlled. The effect upon wave W1 of closing switches 1CR, 2CR, and 3CR and the timing of such closings, will be explained hereinafter by reference to FIG. 2.

Referring to FIG. 1B, the circuit of FIG. 1A is shown inserted in a phase-locked loop (PLL). The output 107 is applied to a controller which is connected in turn to a voltage controlled oscillator VCO. The latter clocks a counter, and the n-bits of the counter are decoded by a decoder to generate the three signals SYNC 1, SYNC 2 and SYNC 3 which control the operation of 1CR, 2CR and 3CR as will now be explained by reference to FIG. 2.

Figure 2:
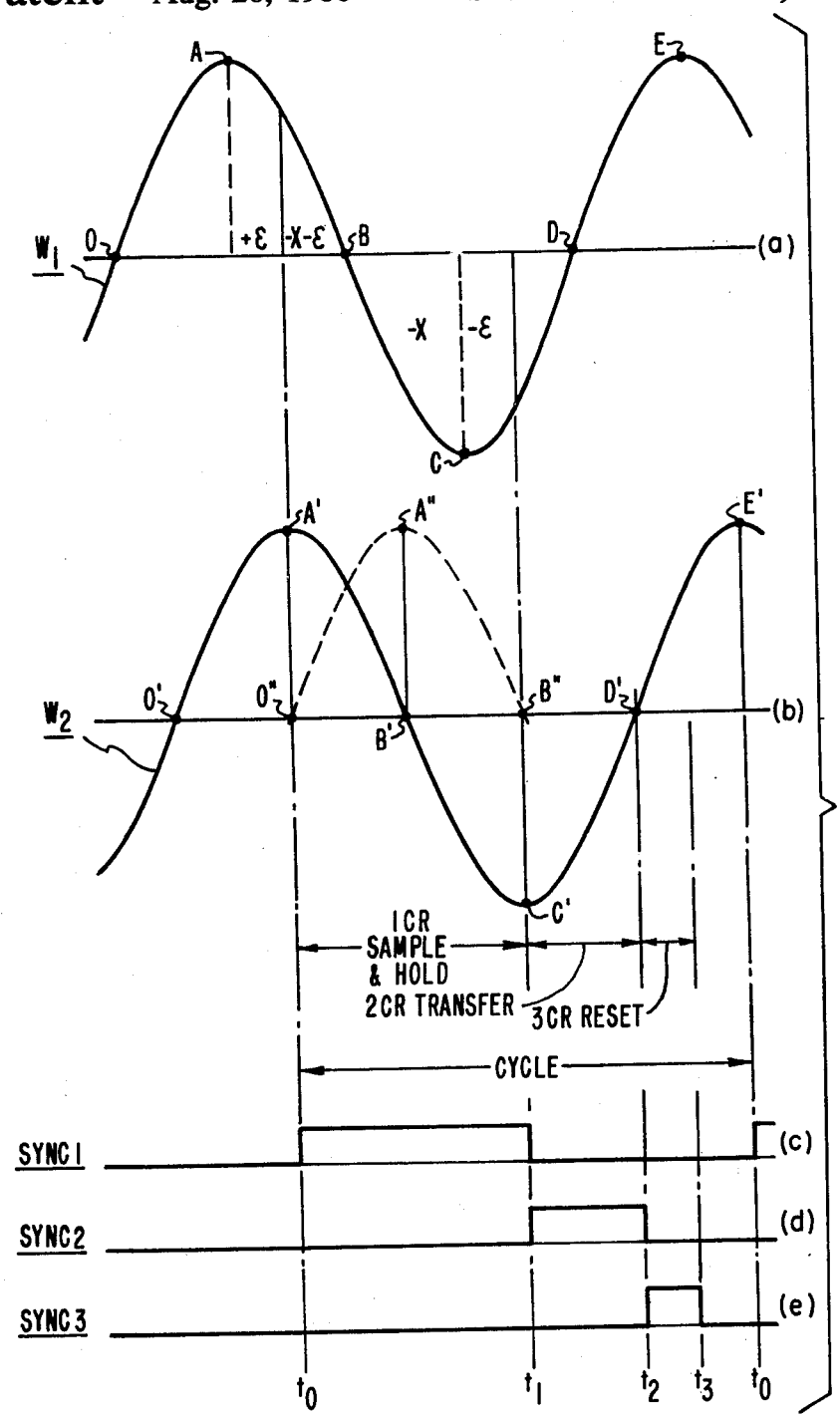
FIG. 2 shows curves illustrating the operation of the system of FIG. 1.

Curves (a) and (b) of FIG. 2 show waves $W_1$ and $W_2$ having a phase shift e. For the sake of clarity, the waves are identical in magnitude as well as in frequency, but this is not a condition necessary for a proper operation of the phase detector of FIG. 1. Curves (c) (d) and (e) are square waves representing SYNC 1, SYNC 2 and SYNC 3 which are the control signals on lines 108, 109 and 110 of FIG. 1.

In dotted line and by reference to curve (b) the phase shifted wave applied to the zero-crossing detector 106 appears as O″A″B″, while wave $W_2$ is O′A′B′C′D′E′ on FIG. 2. Pulse generator PG in a conventional manner is clocked at time $t_0$ corresponding to zero-crossing O″, and generates SYNC 1 which lasts for 180°, in this example, thus defined by two successive zero-crossings. Signals SYNC 2, SYNC 3 are generated in successive order following the falling edge of the preceding one, and each must terminate before the other begins, and SYNC 3 must terminate before rising edge of SYNC 1. The three signals have the same frequency as $W_2$ and $W_1$. The rising edge of SYNC 2 is at time $t_1$ when the edge of SYNC 1 is falling. The rising edge of SYNC 3 and the falling edge of SYNC 2 are at instant $t_2$. The falling edge of SYNC 3 is at instant $t_3$ (as in the text).

The operation of the circuit of FIG. 1 can now be understood from a consideration of switches 1CR, 2CR and 3CR. At instant $t_0$, switch 1CR is closed for a duration equal to a half-cycle and wave $W_1$ is integrated by capacitor C1, assuming 2CR is open; 3CR is also open from $t_0$ to $t_1$. If there were no phase shift of $W_2$ relative to $W_1$, instants $t_0$ and $t_1$ would coincide exactly with the peaks of wave $W_1$. Therefore, integration in the time interval $t_0 - t_1$ would entail positive area from A to B of magnitude $+X$ followed by a negative area from crossover point B to the negative peak C of magnitude $-X$. Due to the phase shift e, $t_0$ is somewhat out of line with the positive peak A of $W_1$ (to the right as illustrated); while instant $t_1$ is shifted by the same amount relative to the ordinate of the negative peak C. The positive area X is reduced by $\epsilon$, while the negative area X is increased by $\epsilon'$, in the example shown. The accumulated charge on C1 represents $(X-\epsilon)-(X+\epsilon')=-(\epsilon+\epsilon')$ which provides an indication of the phase existing between $W_1$ and $W_2$. Thus, from $t_0$ to $t_1$ switch 1CR causes the circuit of operational amplifier 1-OA to perform a sampling of $W_1$.

At time $t_1$ switch 1CR opens and switch 2CR closes. The charge of capacitor C1 is transferred to capacitor C2 which performs a holding function due to the presence of 2-OA. When this is completed, an indication of the phase existing between $W_1$ and $W_2$ has been stored at junction J3 and the information can be read, or displayed, from line 107 at the output of operational amplifier 2-OA. The duration of $(t_1-t_2)$ is made sufficient to complete the transfer of charge from $C_1$ to $C_2$. Arbitrarily, and for the sake of simplicity in generating SYNC 2, $(t_1-t_2)$ has been chosen to be half the duration of $(t_0-t_1)$, or a quarter of a cycle. From $t_2$ to $t_3$ switch 2CR closes, thereby resetting the integrator. $(t_2-t_3)$ is equal to $\frac{1}{8}$ of a cycle. The operation of the successive switches is contained within the same cycle of $W_2$, so that another sample and hold function can be performed with the next crossover; thus, phase detection is performed upon each cycle of wave $W_1$.

The scheme of operation of the phase detection system of FIGS. 1 and 2 is only illustrative. Variations are possible while remaining within the scope of the present invention. For instance, 1CR has been made operative between two successive occurrences of a crossover of the 90° phase shifted wave form $W_2$, e.g., upon the occurrence of successive positive and negative peaks of wave form $W_2$. Indeed, sampling of the $W_1$ wave form can be done about the opposite crossover D rather than B, as shown in FIG. 1. The count could also be done by sampling the areas of wave $W_1$ between two peaks of the same polarity, thus, about the ordinate of an intermediary peak of the opposite polarity. On FIG. 1, it would be from A to E about the ordinate of C. Then, $(t_0-t_1)$ would be equal to 360°. The entire sample and hold operation would then extend over more than one cycle.

It is also conceivable that, instead of establishing a time interval $(t_0-t_1)$ based exclusively upon the occurrence of time related events belonging to the second wave $W_2$, one of the critical instants determining $(t_0-t_1)$ may be fixed by reference to the first wave $W_1$. If at instant $t_0$ switch 1CR is triggered upon the occurrence of the positive peak A of wave $W_1$, and at instant $t_1$ switch 1CR is closed when the negative peak C' of $W_2$ occurs, the integrator will have totalized the full area $+X$ from A to B on wave $W_1$, and to the $-X$ area from B to C will have been added $\epsilon'$ due to the shift of C' on $W_2$ relative to C on $W_1$.

The phase detection system of FIG. 1 assumes the phases of two wave forms $W_1$ and $W_2$ are to be compared. A direct application of this is the phase-locked loop (PLL) since, there, a feedback system synchronizes two periodic wave forms, one being the reference ($W_1$ in the case of FIG. 1), the other a feedback signal. A phase detector is required to determine the phase error between the reference and the feedback signal. The output of the phase detector (on line 107 in FIG. 1), after suitable filtering and integrating, is used to control the PLL oscillator (a voltage controlled oscillator VCO) so that it is synchronized to the reference. The phase detector circuit allows the locally generated square wave to be phase locked to the fundamental of the reference sine wave. This is done preferably by integrating the reference signal for one half cycle, thereby eliminating the effects of noise and harmonic distortion in the reference signal.

At the end of the interval of integration, an indication of the phase error between the periodic operation of the oscillator and the reference wave is obtained. While oscillator and reference are synchronized by the PLL, inherently forcing the oscillator to match the frequency of the reference, the output of the oscillator is applied to a counter which will digitally and instantaneously measure the electrical angles of the sine wave. This technique is conventionally applied to control of the firing angle of thyristors in a static converter.

To summarize, at the end of the sampling period switch 1CR opens, and the voltage at the output of 1-OA represents the phase error between the phase detector input and the feedback control onto 1CR. Capacitor C2 is charged to this voltage when relay 2CR closes. After 2CR opens, 3CR is closed to reset the integrator and after 3CR is opened again, a new cycle is ready to begin. The output is a voltage proportional to the phase error over the previous half-cycle and is updated upon every cycle of the local square wave.

The gain of the phase detector when referenced to the half-cycle condition that the output voltage is zero when the input and feedback signals are shifted 90 degrees, is given by the formula $$K = \frac{2V_m}{W R_1 C_1} \cos e$$

where $V_m$ is the peak voltage of the fundamental of the reference sine wave ($W_1$), w is the angular frequency thereof, $R_1 C_1$ the gain of the integrator, and e the phase error. The invention brings about the following advantages over the prior art:

1. For instance, when the phase detector is sampling at typically a $\frac{1}{2}$ cycle of the input, it will in effect cancel the effects of periodic noise, or harmonics.

2. The sample-hold circuit holds the error information throughout the cycle, thus the frequency of the PLL's VCO is not modulated by the output ripple of the phase detector.

3. The transfer gain of the phase detector is not affected by the frequency division of the PLL.

4. The output of the sample-hold circuit can be fed directly to the VCO of the PLL to obtain frequency locking. If an integral controller is substituted in-between the sample-hold and the VCO, the phase will be locked.

THE PREFERRED EMBODIMENT OF THE INVENTION

The phase detector according to the invention is part of a phase locked loop (PLL) associated with a digital pulse generator for sequential firing of thyristors as can be used in static power converters.

A digital pulse generator using a phase locked loop to derive a digital representation of electrical angles with a reference sine wave is described in U.S. Pat. No. 4,017,744 of F. O. Johnson.

Figure 3:
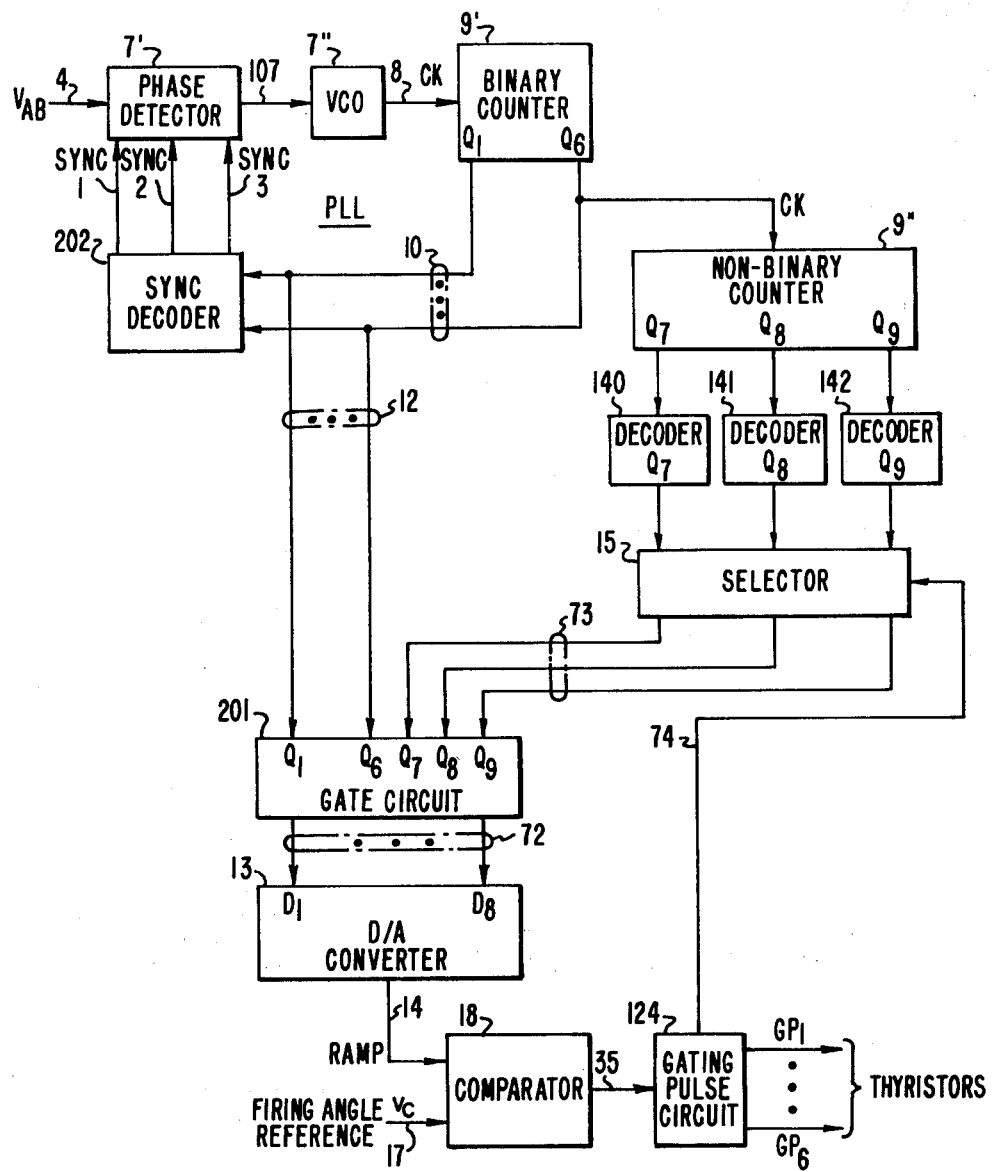
FIG. 3 is a diagrammatic representation of a digital pulse generator using the phase detection system according to the invention.
Figure 4:
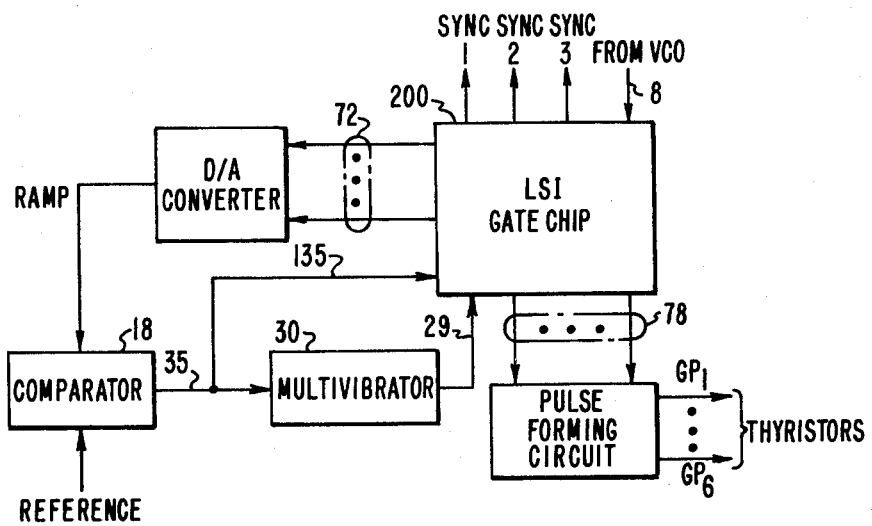
FIG. 4 shows how the circuit of FIG. 3 makes use of an LSI chip.

For the purpose of the description of the preferred embodiment of the invention, copending application Ser. No. 886,390 filed on Mar. 19, 1978, now U.S. Pat. No. 4,173,722, for a "Digital Pulse Generator With End-Stop Detection And Control" by Richard L. Detering is herein incorporated by reference. FIGS. 3, 4 and 5 of this application have been drafted in the context of the aforementioned Detering application, and whenever possible, reference numerals which are like those in the Detering application are being used hereinafter.

Referring to FIG. 3, a diagram is given of the overall digital pulse generator. It is assumed here, as in the Detering application, that the reference sine wave $V_{AB}$ on line 4 is used to select (by reference to a voltage $v_C$ on line 17 to a comparator 18) the fire angles of six thyristors to be fired sequentially. A D/A converter 13 generates the ramp 14 which represents in analog form the instantaneous electrical angles on $V_{AB}$. When the threshold is reached within comparator 18, a control signal 35 triggers the gating pulse circuit 124 and, in accordance with a suitable logic, the thyristor next to be fired is controlled by a corresponding one of the gating pulses $G_1$–$G_6$.

The phase locked loop comprises a phase detector 7' and a voltage controlled oscillator (VCO) 7". The VCO clocks a counter comprising a six digit binary counter 9' ($Q_1$–$Q_6$) and a non-binary three digit counter 9" ($Q_7$, $Q_8$, $Q_9$). The six digits of lowest significance ($Q_1$–$Q_6$) are fed back by lines 10 to a decoder 202 which, according to the invention, generates the three control signals SYNC 1, SYNC 2 and SYNC 3 activating the three switches 1CR, 2CR, 3CR of FIG. 1 within the phase detector 7'. As explained in the Detering application, $Q_7$, $Q_8$, $Q_9$ are decoded at 140, 141, 142 to provide digits $Q_7$, $Q_8$, $Q_9$ in binary form, matching those from counter 9' on line 12. A selector 15 controlled over line 74 by the ring-counter within gating pulse circuit 24 establishes the proper correspondence between the phase line and the "next" thyristor.

The gate circuit 201 combines $Q_1$–$Q_9$ to generate in digital form ($D_1$–$D_8$) a ramp which is converted to analog by the D/A converter 13.

FIG. 4 illustrates in diagram form the specific organization of the preferred embodiment with respect to the circuitry directly related to the invention. A large scale integrated (LSI) chip 200 is used for the gate circuit as well as for the counters 9', 9", the decoders 140, 141, 142, the selector 15 and the SYNC decoder 202. The multivibrator, which is part of the gating pulse circuit, is shown separately at 30 controlling by line 29 the LSI gate chip, and the latter is shown controlling by lines 78 the pulse generator proper within the gating pulse circuit 124 of FIG. 3.

From the LSI gate circuit are derived, as shown, signals SYNC 1, SYNC 2 and SYNC 3 to the phase detector 7' of FIG. 3. The clock signal 8 applied to the binary counter 9' from the VCO is shown entering the LSI gate chip.

Comparator 18 is responsive to the reference signal $v_C$ on line 17 and to the ramp supplied on line 14 by the output of digital-to-analog converter 13, the latter consisting in an 8-bit solid state device. The output is applied to multivibrator 30. The latter is an MC14528 solid state device having the appropriate time constant (100K resistor and 510 pf capacitor). The output 29 which carries the hard pulse is fed into the LSI chip 200.

The LSI circuit, thus, receives as inputs the clock signal, on line 8, and the hard pulse from the multivibrator 30, on line 29. In addition, the logic of the output of comparator 18 is inputted via line 135 into the LSI circuit. Lines 72 from circuit 200 provide the eight bits for the 8-bit DAC 13. The sync signals SYNC 1, SYNC 2 and SYNC 3 are also derived from circuit 200. A gate pulse generator contained within circuit 200, is outputting on lines 78 the firing pulses to the pulse-forming circuit generating the gating pulses $GP_1$ and $GP_6$ controlling the electrodes of the thyristors.

Figure 5A:
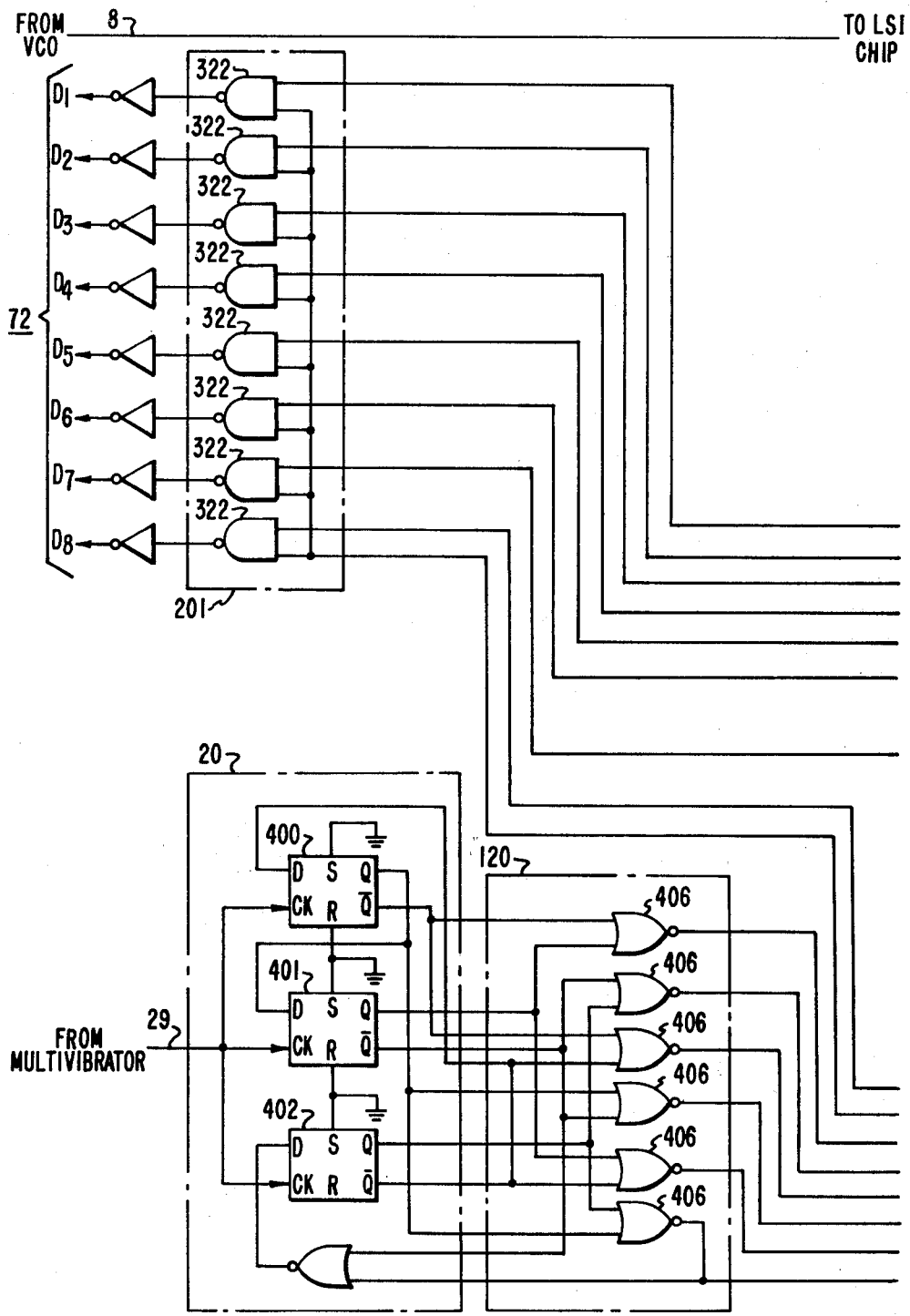
FIGS. 5A, 5B and 5C illustrate the internal organization of the LSI chip of FIG. 4.
Figure 5B:
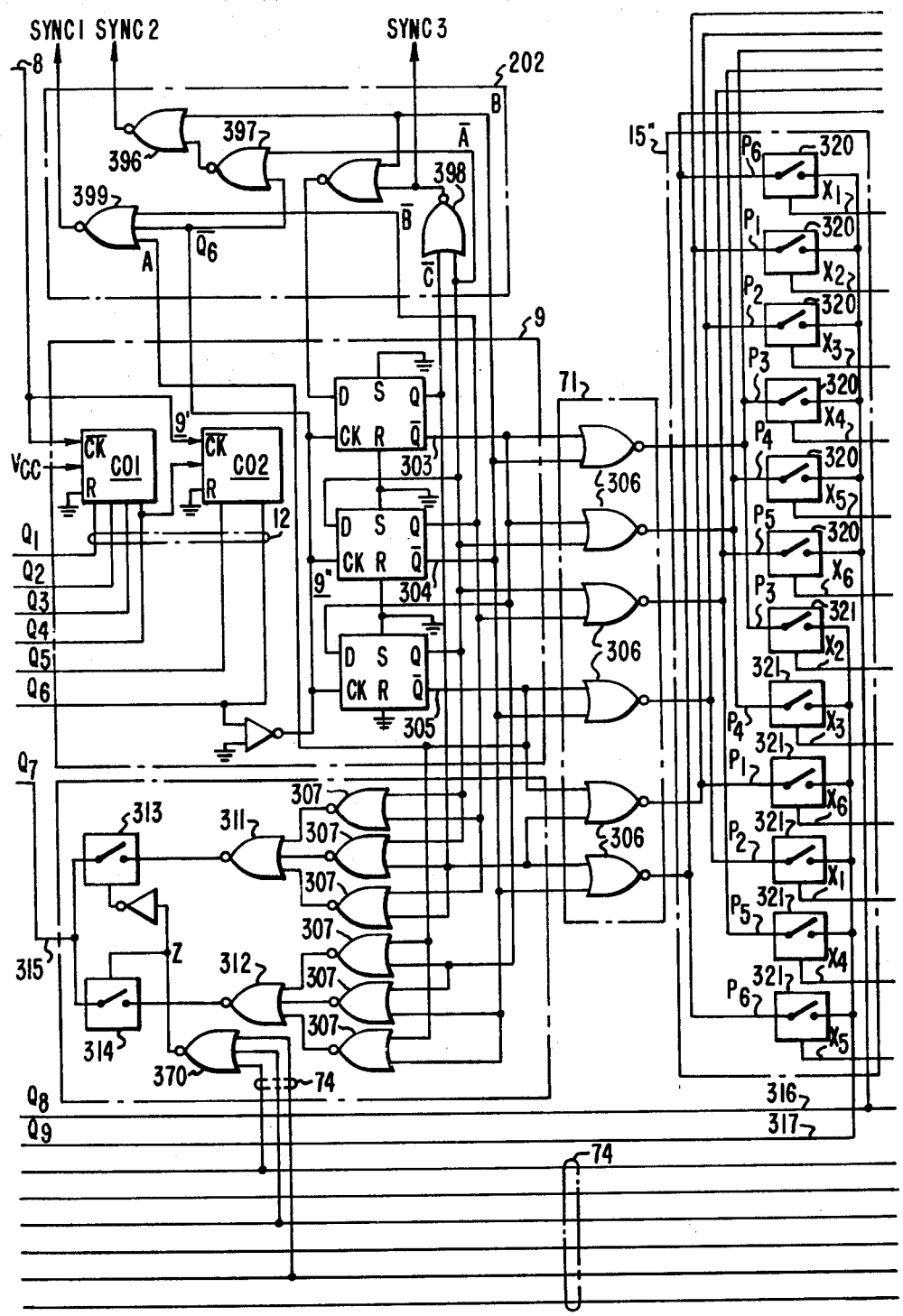
Figure 5C:
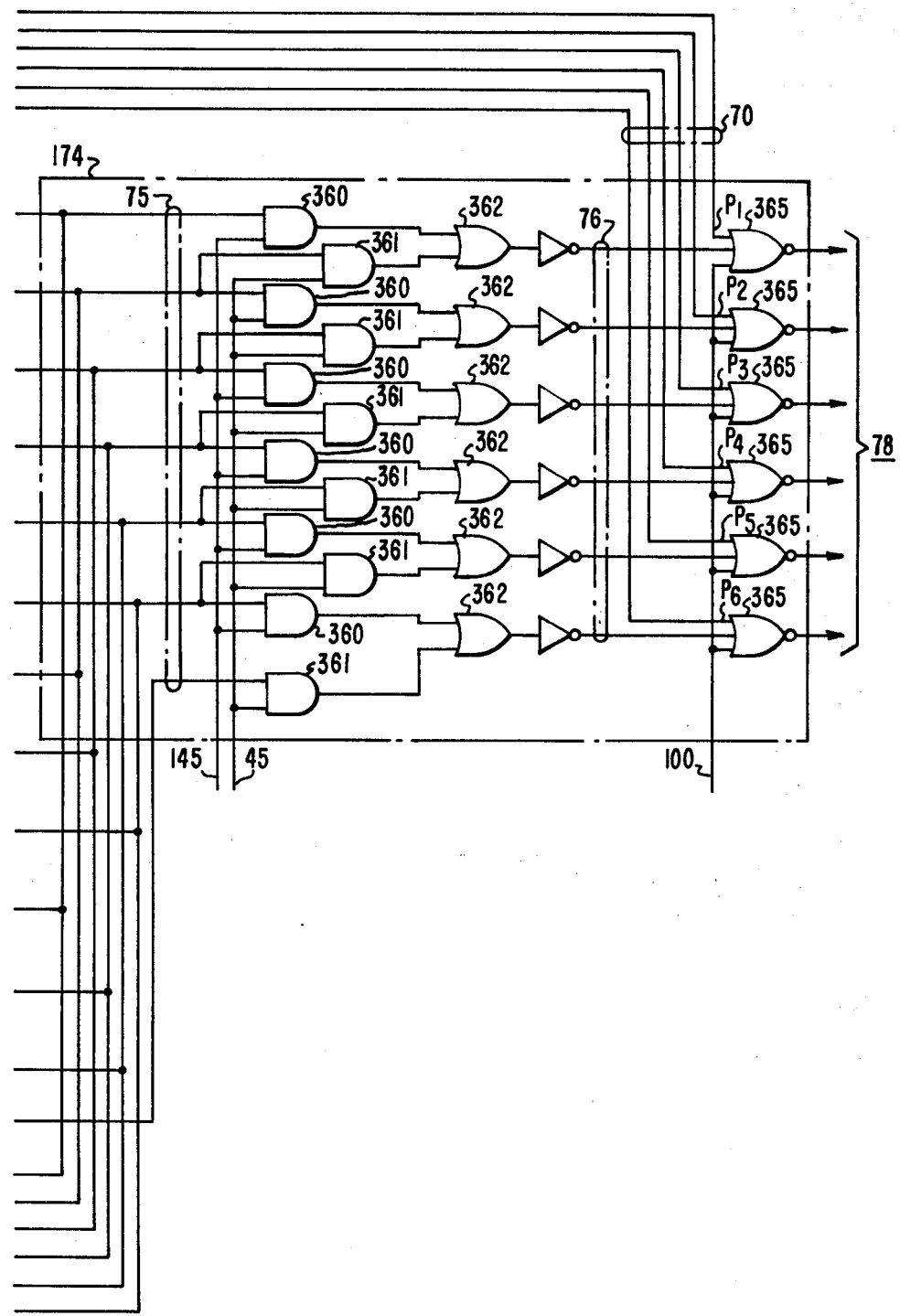

Referring to FIGS. 5A, 5B, 5C, the internal organization of circuit 200 will be now considered in detail. The operation of this circuit will also be explained by reference to the curves of FIG. 6.

Referring to FIG. 5B, counter 9' (consisting of two solid state units CO1, CO2, known together as type 4520, clocked by line 8) appears within circuit 200 with its bits $Q_1$–$Q_6$ applied via lines 12 to corresponding NOR gates of circuit 201. Counter 9" is a Johnson-counter having states A, B, C as shown on the Q pins (lines 303–305) of the three solid state devices 300–302 (type 4013). Counter 9" is triggered (clock pin) by a ZERO to ONE transition of $Q_6$ from counter 9'. Within SYNC decoder circuit 202 states A, B and $\overline{Q}_6$ are decoded by NOR gate 399 to form the SYNC 1 signal of line 11. States $\overline{A}$, $\overline{C}$ are decoded by NOR gate 398 to form SYNC 3. NOR gate 397 decodes $\overline{A}$ v $\overline{Q}_6$=X and NOR gate 396 decodes with NOR gate 397 $\overline{X}vB$ which is SYNC 2. NOR devices 306 of circuit 71 decode states CB (for $P_3$), $\overline{CA}$ (for $P_4$), $\overline{AB}$ (for $P_5$), AB (for $P_2$) $A\overline{C}$ (for $P_1$) and $\overline{CB}$ (for $P_6$), where $P_1$–$P_6$ are the sequence of channels for the respective thyristors $T_1$–$T_6$. These appear on lines 70 to NOR gates 365 of circuit 174 outputting gate pulses on respective lines 78 from circuit 200.

Switches 320 for multiplexer 15" and $Q_8$, and switches 321 for multiplexer 15''' and $Q_9$, provide the selection of the respective channels $P_1$–$P_6$ on lines 310 from circuit 71. These switches are controlled by addresses $X_1$–$X_6$ on line 74 from demultiplexer address decoder 120 associated with the ring counter 20 within gating pulse circuit 124 (FIG. 3). The relation is as shown: $X_1$ for $P_6$ in 15' and $P_2$ in 15"; $X_2$ for $P_1$ and $P_3$; $X_3$ for $P_2$, $P_4$; $X_4$ for $P_3$, $P_5$; $X_5$ for $P_4$, $P_6$ and $X_6$ for $P_5$, $P_1$. Thus, multiplexer 15" provides $Q_8$ on line 316 and multiplexer 15' provides $Q_9$ on line 317. Taking advantage of certain symmetries, addresses $X_1$, $X_3$ and $X_5$, via NOR gate 370, control the outputted logic Z which for one logical state controls switch 314 and for the complement control switch 313. By proper decoding of the states of counter 9" with NOR gates 307 and NOR gates 311, 312 (one for the direct and the other for the complement) $Q_7$ is obtained on line 315. Circuit 201 consists of NAND gates 322 all controlled by $\overline{Q}_9$ from line 422. The second inputs of NAND gate 322 are respectively $Q_1$–$Q_8$. Therefore, whenever the logic $\overline{Q}_9$ is present on line 422, none of $Q_1$ through $Q_8$ will be outputted on lines 72 at the output of circuit 201, thereby to use only eight bits for D/A converter 13 as explained in the Detering patent application. Also, as explained in the Detering application, gates 360, 361 and 365 within circuit 174 are gated by signals on lines 145, 45 and 100, respectively.

Figure 6:
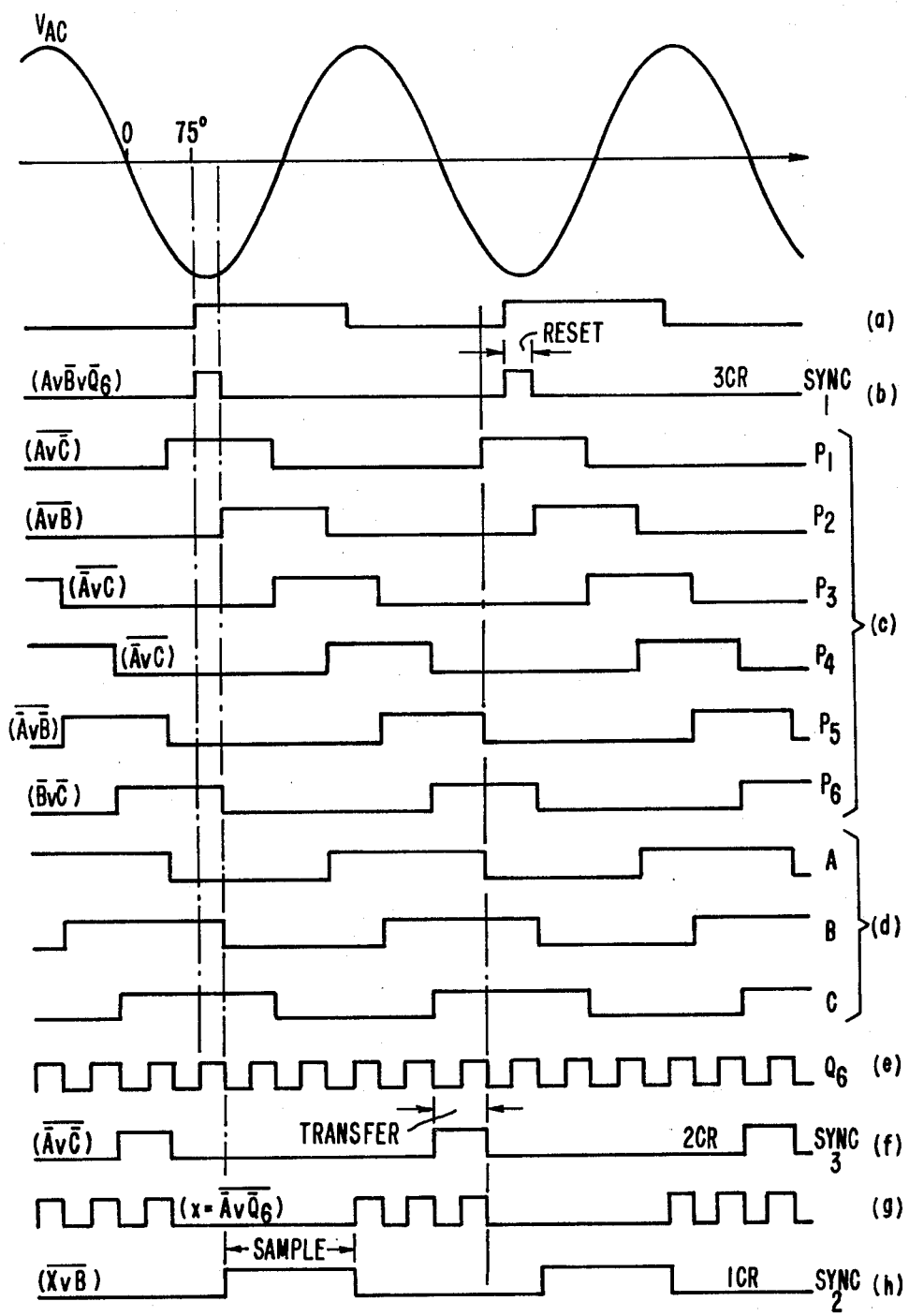
FIG. 6 shows curves illustrating the operation of the circuit of FIGS. 5A, 5B, 5C.

FIG. 6 represents wave $V_{AB}$ used as a reference. Curve (a) is the signal inputted at pin 14 of the phase-locked loop device PLL 4046 used in practice as in the Detering application, e.g., after effecting a 75° phase shift. Curve (b) is the SYNC 1 signal received on line 108 and aligned by one edge with the signal of curve (a) due to the phase-locking action. Curves (d) are the A, B, C states of counter 9" triggered by $Q_6$ (curve (e) from counter 9', itself triggered by the clock signal of line 8. $P_1$ present on one of lines 310 is obtained as one of curves (c) by decoding of $(\overline{A} \vee \overline{C})$ from the Johnson-counter. Similarly, $P_2=(\overline{A} \vee \overline{B})$; $P_3=(\overline{B} \vee \overline{C})$; $P_4=(\overline{A} \vee \overline{C})$; $P_5=(\overline{A} \vee \overline{B})$ and $P_6=(\overline{B} \vee \overline{C})$.

Curve (f) is SYNC 3 represented by the logic $\overline{A} \vee \overline{C}$. Curve (g) is $X = \overline{A} \vee \overline{Q}_6$ and curve (h) is SYNC 2 represented by the logic $\overline{X} \vee \overline{B}$, as explained hereinbefore.

Figure 7:
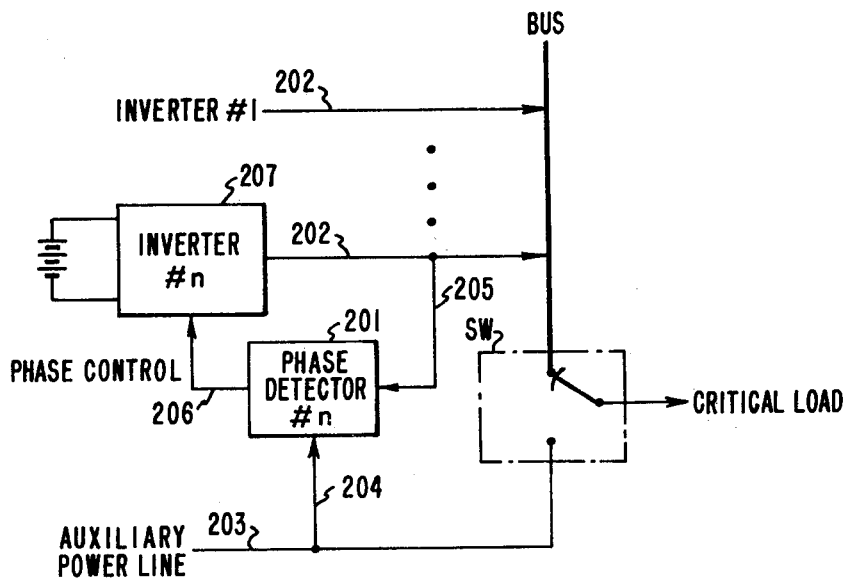
FIG. 7 shows an uninterruptible power supply using the phase detection system according to the invention.

Referring to FIG. 7, an uninterruptible power supply (UPS) is shown making use of the phase detector (201) according to the present invention, for the purpose of synchronizing two feeder lines before effectively transferring the power applied to the critical load from one feeder to the other. The UPS includes a plurality of inverters such as 200 supplied with direct current power and generating AC power on lines 202 to a bus line energizing a critical load. If at any given moment, the power instead of from inverter 200 is to be derived from an auxiliary power line 203, before actuating a power switch SW, it is necessary that the two sources be in phase. To this effect, a phase detector 201 such as described hereabove, is inserted in circuit so as to detect the phase difference between lines 204 (with regard to line 203) and 205 (with regard to line 202). The detected phase is used through line 206 to control the phase of the inverter and cause synchronism.

I claim:

1. A phase detector apparatus for deriving an indication of the phase difference between first and second alternating-current signals having a fixed periodicity relationship, comprising:
   means for establishing by reference to said second signal a predetermined time interval centered on a zero-crossing point thereof;
   means for integrating said first signal during said time interval to derive an integrated value; and
   means responsive to said integrated value for providing an indicative signal characteristic of said phase difference.

2. A phase-locked loop including: the phase detector apparatus of claim 1, a voltage-controlled oscillator controlled by said indicative signal;
   said time interval establishing means being responsive to said voltage-controlled oscillator through a feedback signal as said second alternating current signal;
   whereby the output of said voltage-controlled oscillator is held synchronized with said first signal in accordance with the magnitude of the phase difference between said first signal and said feedback signal.

3. The phase-locked loop of claim 2 with digital counter means responsive to said voltage-controlled oscillator for deriving a digital count; and
   means responsive to said counter means for establishing said predetermined time interval in relation to said digital count.

* * * * *